United States Patent
Luoh et al.

(10) Patent No.: US 8,828,861 B2
(45) Date of Patent: Sep. 9, 2014

(54) METHOD FOR FABRICATING CONDUCTIVE LINES OF A SEMICONDUCTOR DEVICE

(75) Inventors: Tuung Luoh, Taipei (TW); Ming Da Cheng, Tonfene (TW); Chin-Ta Su, Yunli (TW); Tahone Yang, Miaoli (TW); Kuang-Chao Chen, Taipei (TW)

(73) Assignee: Macronix International Co., Ltd. (TW)

( * ) Notice: Subject to any disclaimer, the term of this patent is extended or adjusted under 35 U.S.C. 154(b) by 328 days.

(21) Appl. No.: 12/860,347

(22) Filed: Aug. 20, 2010

(65) Prior Publication Data

US 2012/0043657 A1    Feb. 23, 2012

(51) Int. Cl.
H01L 21/4763    (2006.01)
H01L 21/768    (2006.01)
H01L 23/532    (2006.01)

(52) U.S. Cl.
CPC .... *H01L 21/76885* (2013.01); *H01L 21/76852* (2013.01); *H01L 23/53223* (2013.01)
USPC ........... 438/622; 438/444; 438/592; 438/618; 438/628; 438/653; 438/654; 438/669; 438/785

(58) Field of Classification Search
CPC ................... H01L 21/76885; H01L 21/76852; H01L 23/53223
USPC ......... 438/669, 444, 592, 618, 622, 628, 653, 438/654, 785
See application file for complete search history.

(56) References Cited

U.S. PATENT DOCUMENTS

| | | | | |
|---|---|---|---|---|
| 5,332,693 A | * | 7/1994 | Kim | 438/648 |
| 6,084,302 A | * | 7/2000 | Sandhu | 257/751 |
| 6,143,672 A | * | 11/2000 | Ngo et al. | 438/787 |
| 6,468,908 B1 | * | 10/2002 | Chen et al. | 438/687 |
| 6,677,647 B1 | * | 1/2004 | Dawson | 257/368 |
| 2001/0030351 A1 | * | 10/2001 | Wang et al. | 257/508 |
| 2002/0135040 A1 | * | 9/2002 | Li et al. | 257/508 |
| 2003/0001264 A1 | * | 1/2003 | Naik | 257/751 |
| 2003/0116826 A1 | * | 6/2003 | Hsue et al. | 257/650 |
| 2003/0157788 A1 | * | 8/2003 | Honeycutt | 438/586 |
| 2004/0145055 A1 | * | 7/2004 | Kobayashi | 257/751 |
| 2004/0219757 A1 | * | 11/2004 | Olewine et al. | 438/381 |
| 2005/0085066 A1 | * | 4/2005 | Tsao et al. | 438/633 |
| 2011/0115038 A1 | * | 5/2011 | Kanemoto | 257/418 |

OTHER PUBLICATIONS

Hopwood, Research—Ionized Physical Vapor Deposition (I-PVD), Tufts Plasma Engineering Laboratory, pp. 1-3.*

* cited by examiner

*Primary Examiner* — Anthony Ho
*Assistant Examiner* — David Chen
(74) *Attorney, Agent, or Firm* — Baker & McKenzie LLP

(57) ABSTRACT

Methods for fabricating conductive metal lines of a semiconductor device are described herein. In one embodiment, such a method may comprise depositing a conductive material over a substrate, and depositing a first barrier layer on the conductive layer. Such a method may also comprise patterning a mask on the first barrier layer, the pattern comprising a layout of the conductive lines. Such an exemplary method may also comprise etching the conductive material and the first barrier layer using the patterned mask to form the conductive lines. In addition, a low temperature post-flow may be performed on the structure. The method may also include depositing a dielectric material over and between the patterned conductive lines.

14 Claims, 5 Drawing Sheets

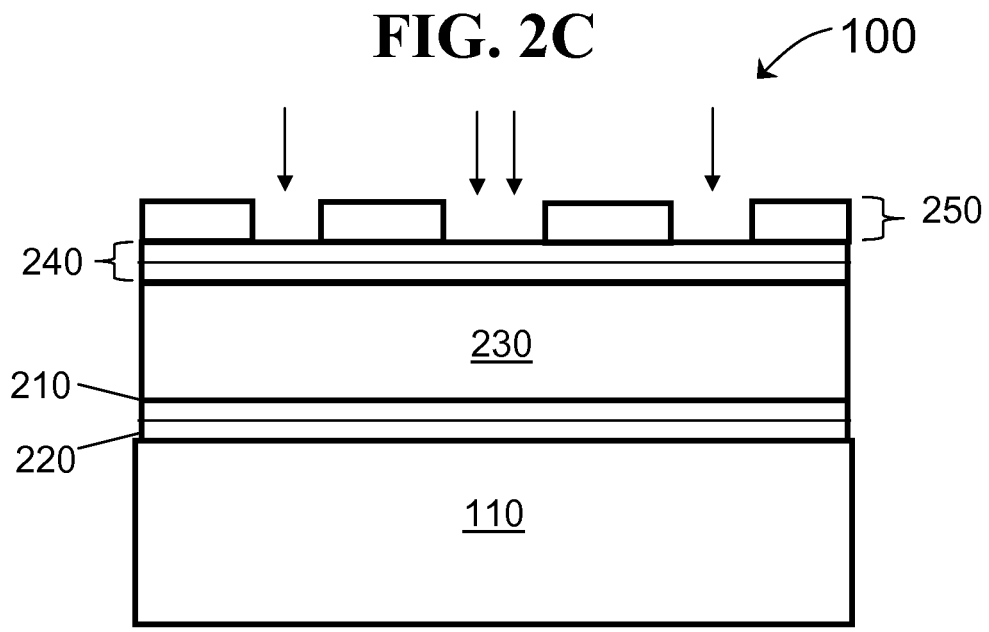
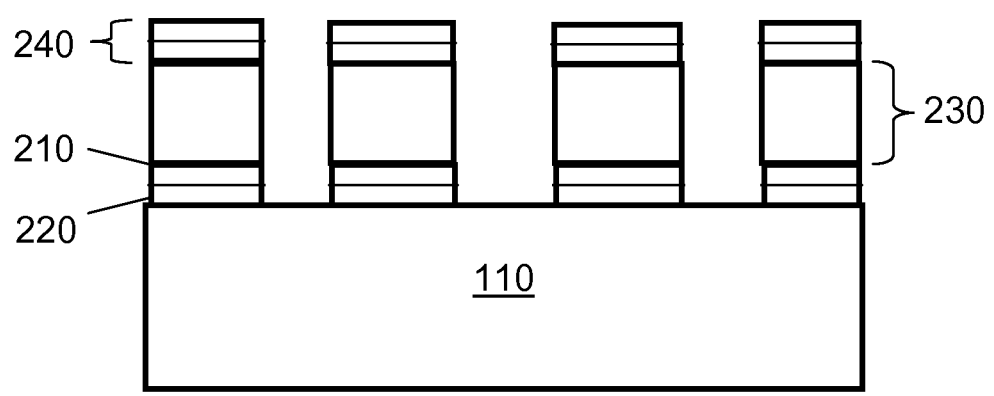

METHOD FOR FABRICATING CONDUCTIVE LINES OF A SEMICONDUCTOR DEVICE

BACKGROUND

1. Technical Field

The present invention relates to a method for fabricating conductive lines, and more particularly, to a method for fabricating conductive metal lines of a semiconductor device.

2. Related Art

As sizes of semiconductor devices constantly are reduced, successful formation of I-shaped conductive line patterning using conventional etching techniques becomes increasingly more difficult. Accordingly, use of bottom barriers, such as a Ti/TiN layer, are sometimes unnecessary. However, by foregoing the use of the bottom barriers, it is easy to induce hillock formation.

Conventionally, conductive lines can be formed using a BPSG film and a conductive layer that includes Al/Ti/TiN, or Al/TiN and a hard mask (HM) oxide. Alternatively, conductive lines may commonly be formed using a high density plasma (HDP) with post annealing before patterning. However, due to stress mismatch between the individual layers, hillocks and bumps are easily formed.

FIGS. 1A and 1B are cross-sectional views of a conventional method for fabricating semiconductor devices. In FIG. 1A, a device 10a includes formation of conductive lines 12a on a substrate 14a without the use of a deposited film. As a result, the conductive lines 12a are formed having hillocks 16. In FIG. 1B, a device 10b includes formation of conductive lines 12b on a substrate 14b with the use of a deposited film 18. As a result, use of the deposited film 18 results in formation of the conductive lines 12b having hillocks 16 and bumps 20 due to the stress mis-match between the deposited film 18 and the material(s) used to form the conductive lines 12b. Accordingly, an improved method is required to successfully form conductive lines without introducing hillock or bump formations.

SUMMARY

Methods for fabricating conductive metal lines of a semiconductor device are described herein. In one embodiment, such a method may comprise depositing a conductive material over a substrate, and depositing a first barrier layer on the conductive layer. Such a method may also comprise patterning a mask on the first barrier layer, the pattern comprising a layout of the conductive lines. Such an exemplary method may also comprise etching the conductive material and the first barrier layer using the patterned mask to form the conductive lines. In addition, a low temperature post-flow may be performed on the structure. The method may also include depositing a dielectric material over and between the patterned conductive lines. These and other embodiments of the invention are described below in the section entitled "Detailed Description." It is to be understood that both the foregoing general description and the following detailed description are exemplary, and are not intended to limit the scope of the invention.

BRIEF DESCRIPTION OF THE DRAWINGS

Features, aspects, and embodiments of the inventions are described in conjunction with the attached drawings, in which.

DETAILED DESCRIPTION

Figure 1A:
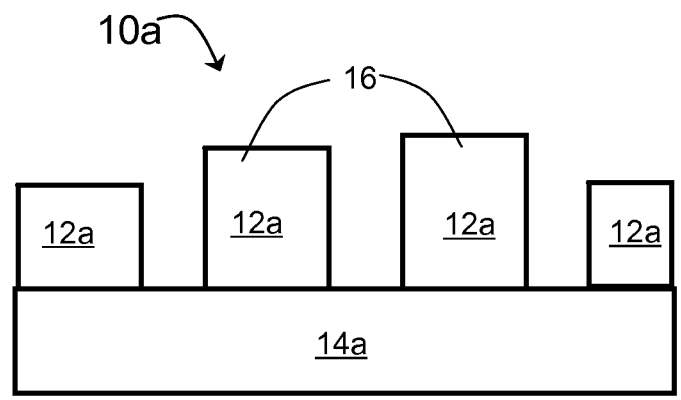
FIGS. 1A and 1B are cross-sectional views of a conventional method for fabricating semiconductor devices.
Figure 1B:
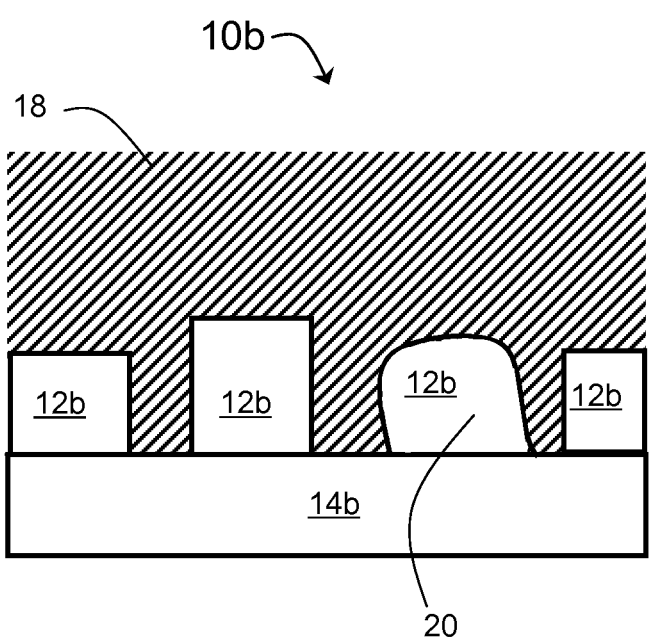
Figure 2:
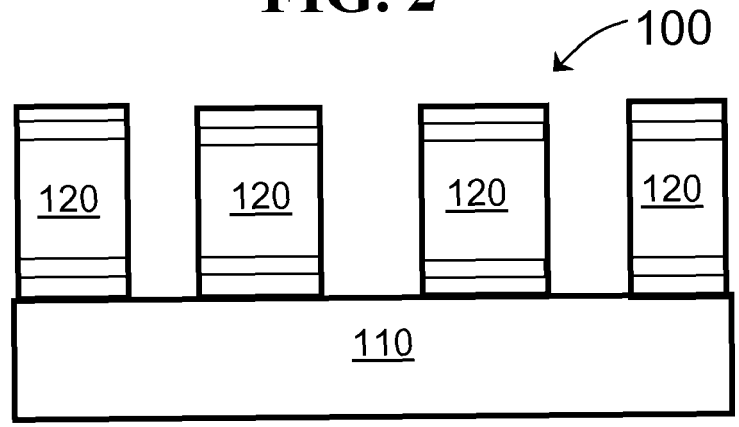
FIGS. 2-2G are cross-sectional views of an exemplary method for fabricating semiconductor devices according to the present embodiment.

FIG. 2 is a cross-sectional view of an exemplary embodiment of semiconductor devices according to the present embodiment. Specifically, FIG. 2 illustrates a semiconductor device 100 having a plurality of conductive lines 120 formed on an underlying substrate 110 using photolithographic and etching processes as disclosed herein. In advantageous embodiments, each of the conductive lines 120 may be formed from material(s) such as aluminum, and the substrate 110 may be formed of BPSG. Additionally, each of the plurality of conductive lines 120 may be substantially identical. Although not specifically shown, the substrate 110 may include doped regions for various semiconductor devices. Accordingly, the conductive lines 120 may correspond, either directly or indirectly, to the doped regions within the substrate 110.

Figure 2A:
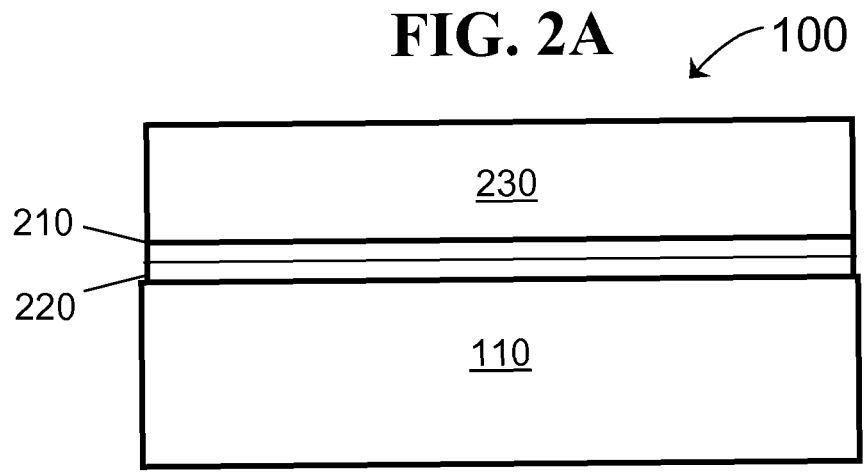

Looking specifically at the steps employed in accordance with the disclosed principles for forming the conductive lines 120, FIGS. 2A-2D illustrates semiconductor processing steps that may be conducted using the disclosed principles. FIG. 2A, illustrates a cross-section view of the semiconductor device 100 during an early stage of manufacture. Specifically, while not required while practicing the disclosed technique, a initial Ti 210 layer or Ti/TiN layer 210/220 may first be deposited on the substrate 110. Thereafter, in accordance with the disclosed technique, a layer of aluminum 230 is deposited on the Ti/TiN layer 210/220, or alternatively directly on the substrate 110. After the deposition of the aluminum layer 230, an optional in-situ cooling process for the aluminum 230 may be conducted, although not required.

Figure 2B:
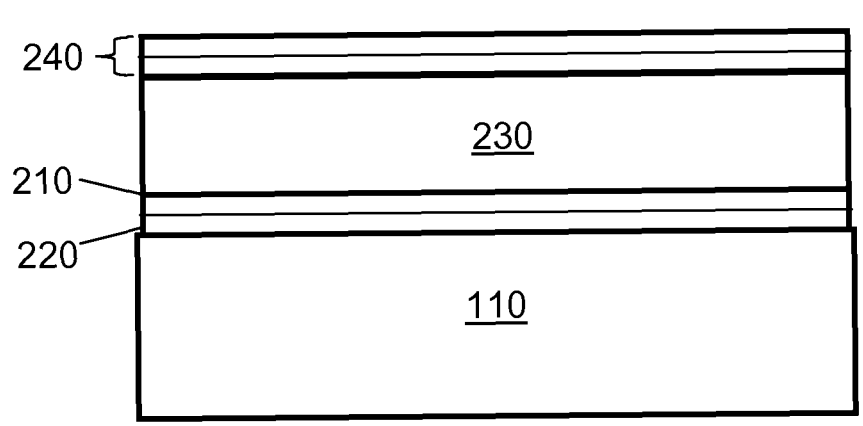

Looking at FIG. 2B, illustrated is a cross-section view of the semiconductor device 100 further along in the manufacturing process conducted in accordance with the disclosed principles. Specifically, a Ti/TiN layer 240 is deposited directly on the aluminum layer 230. For example, a physical vapor deposition (PVD) or ionized metal plasma (IMP) may be employed to for the Ti portion of the layer 240 on the aluminum layer 230. In addition, a Metal-Organic Chemical Vapor Deposition (MOCVD) process may be employed to form the TiN portion of the layer 240. After this deposition, an optional annealing step may be performed on the intermediate structure shown in FIG. 2B. For example, such an annealing process may be conducted at a temperature of about 300° C. to 550° C., and for a period of time of about 10 minutes to 4 hours. Such an annealing process may help to further reduce stress mismatch between the aluminum 230 and Ti/TiN 240 layers. Of course, other advantageous annealing parameters may also be employed.

FIG. 2C illustrates a cross-section view of the semiconductor device 100 even further along in the manufacturing process conducted in accordance with the disclosed principles. Specifically, FIG. 2C illustrates the patterning and etching of the previously deposited layers 210, 220, 230, 240 of the device 100. To pattern and etch the metal lines, a hard mask deposition technique may be employed. Once the mask 250 is deposited over the device 100, the mask 250 is patterned with the desired profile of the metal conductive lines. In addition, an optional annealing process may implemented on the deposited and patterned mask 250 prior to the etching of the layers underlying the mask 250. FIG. 2D illustrates a cross-section view of the semiconductor device 100 after the patterning and etching of the stacks that will form the conductive lines 120. In addition, the remaining portions of the mask 250 have been removed from the device 100.

Figure 2E:
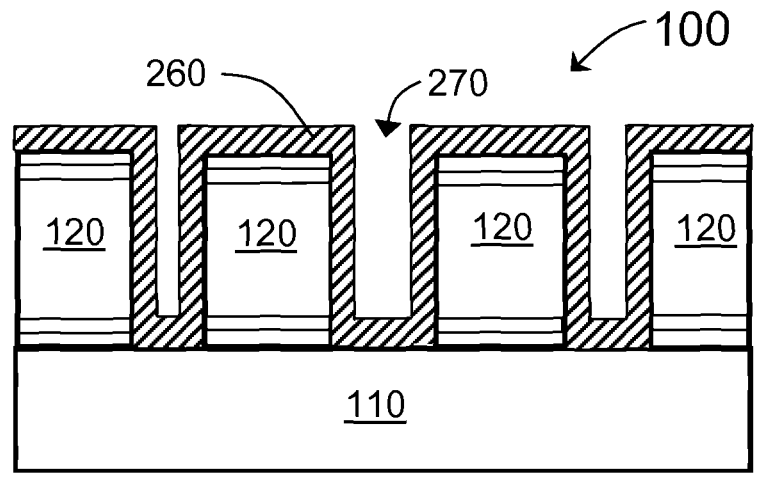

In FIG. 2E, an optional barrier layer 260 is formed over the plurality of conductive lines 120 and on an upper surface of the substrate 110 within a trench portion 270 between adjacent ones of the conductive lines 120. Here, the barrier layer 260 may be formed having a substantially uniform thickness along top and sidewall portions of the conductive lines 120 and along the upper surface of the substrate 110 within the trench portion 140. For example, the barrier layer 260 may include a Ti layer formed by using an ionized metal plasma (IMP) of Ti or a PVD process, or a Ti/TiN layer using an ionized metal plasma (IMP) of Ti and one of a Metal-Organic Chemical Vapor Deposition (MOCVD) of TiN, a Physical Vapor Deposition (PVD) of TiN, and Self Ionized Plasma (SIP) PVD of TiN. In addition, formation of the semiconductor device 100 may include formation of an insulating layer (not shown) over the barrier layer 260 using a hard mask (HM) oxide or a high density plasma (HDP).

Figure 2F:
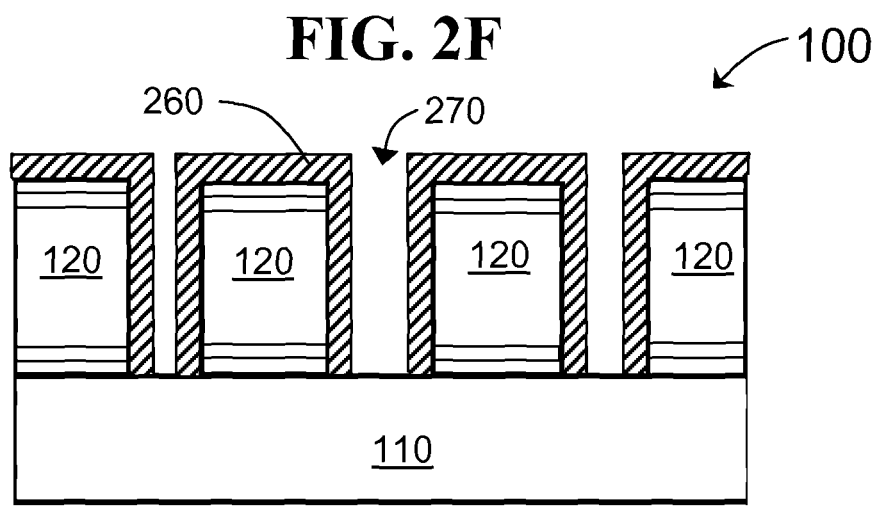

If a barrier layer 260 is employed in the device 100 as shown in FIG. 2E, then that barrier layer 260 should be etched such that the conductive lines 120 do not short circuit in the finished device 100. More specifically, looking at FIG. 2F, illustrated is a cross-section view of the semiconductor device 100 after undergoing a photolithographic and etching process in order to remove portions of the barrier layer 260 disposed within the trench portions 270. For example, the semiconductor device 100 may undergo anisotropic etching to remove only the portions of the barrier layer 260 within the trench portions 140. Accordingly, the barrier layer 260 remains along the top and sidewalls of the conductive lines 120, but portions of the barrier layer 260 on the substrate between the conductive lines 120 is removed to prevent bridging of such material, as well as hillock formation and other potential formation issues among and/or between the conductive lines 120. Such formation issues can become increasingly troublesome as device/line sizes are decreased. Moreover, spacing between conductive lines 120 can be decreased, thus saving device real estate, without the increased risk of such formation issues between the lines 120. After the etching of the barrier layer 260, another optional annealing step may be performed on the intermediate structure. For example, such an annealing process may be conducted at a temperature of about 300° C. to 550° C., and for a period of time of about 10 minutes to 4 hours. Whether the Ti/TiN liner 260 is employed or not, after the conductive lines 120 have been etched, an optional low-temperature post-flow processing step may also be performed on the patterned structure. For example, an HDP with Helium (He) cooling may be employed.

Figure 2G:
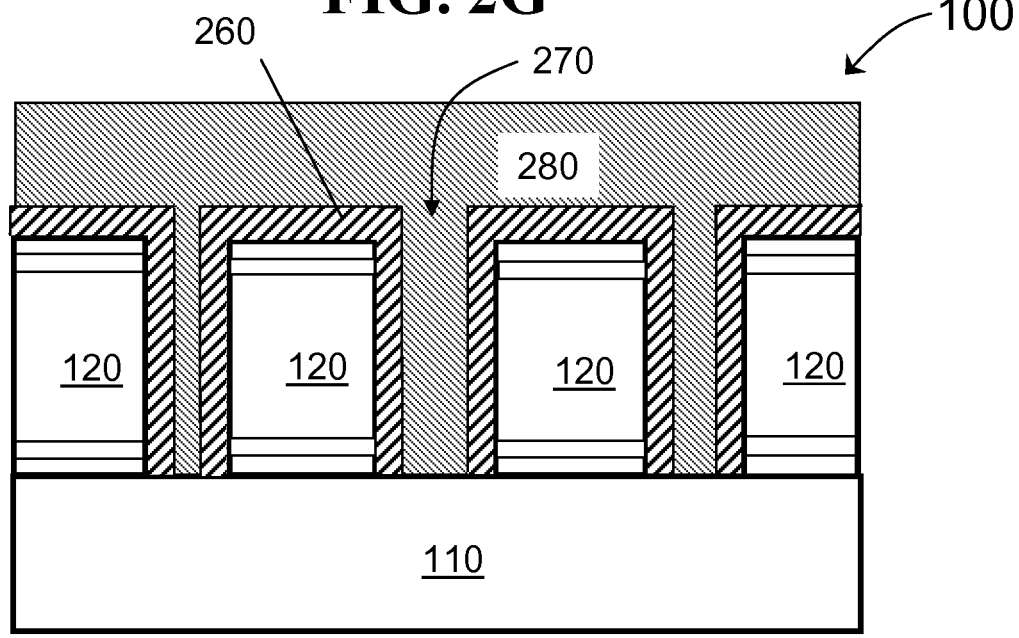
Figure 3:
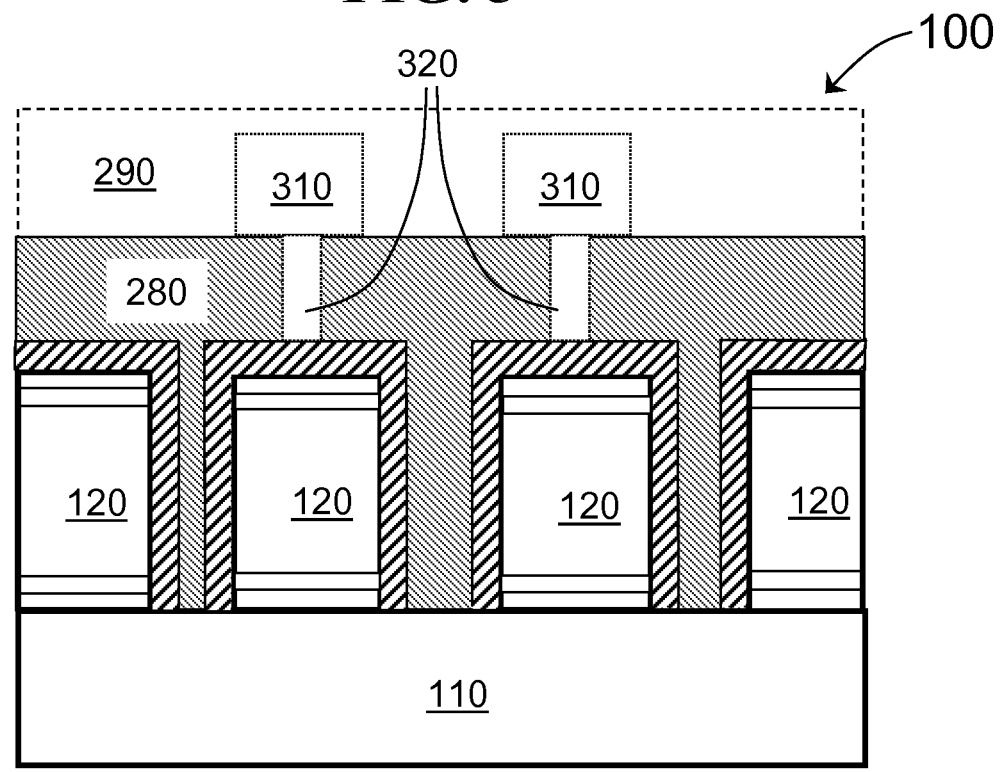
FIG. 3 is a cross-sectional view of an exemplary conductive structure fabricating according to another embodiment.

In FIG. 2G, an insulating layer 280 may be formed over the semiconductor device 100. For example, the insulating layer 280 may include an inter-metal dielectric (IMD) material. Then, the insulating layer 280 may be patterned to form vias interconnecting ones of the conductive lines 120 with subsequently formed conductive lines and/or devices. For example, as shown in FIG. 3, a semiconductor device 100 is formed having vias that may include adhesion films and a tungsten fill-in 310 formed through the insulating layer 150. Accordingly, if additional conductive lines or vias 320 are formed above the conductive lines 120 in another insulating layer 290, then conductive structures can be formed having substantially I-shaped geometries. Here, the adhesion films and tungsten fill-in 310 of the conductive structures may extend through the barrier layer 260 to contact an upper surface of the conductive line 120, or may contact an upper surface of the barrier layer 260. Similarly, although not specifically shown, the additional conductive lines 320 may also include formation of barrier layers, as detailed above.

In FIGS. 2A-2G, embodiments of an exemplary process for forming the semiconductor device 100 conducted in accordance with the disclosed principles is illustrated, and may include:

(1) Formation of conductive lines by deposition of conductive material(s), such as aluminum at a temperature of about 200° C. to 400° C. on a substrate;
   (a) optional Ti or Ti/TiN layer initially deposited on the substrate;
   (b) optional in-situ cooling of the substrate and layer(s);
(2) Deposition of a barrier layer over the conductive layer, such as Ti and/or Ti/TiN using PVD or IMP of Ti and MOCVD of TiN;
   (a) optional post annealing after formation of the barrier layer;
(3) Formation of photolithographic mask and patterning of conductive lines;
   (a) optional annealing after patterning of mask;
(4) Etching aluminum layer and optional additional layer(s) to form the conductive lines;
   (a) optional deposition of a barrier layer over and between the etched conductive lines, such as Ti and/or Ti/TiN using PVD or IMP of Ti and MOCVD of TiN;
   (b) etching to remove portions of the barrier layer between the conductive lines, leaving portions of the barrier layer on the top and sidewall portions of each of the conductive lines;
   (c) optional annealing step after removing portions of barrier layer between the conductive lines;
(5) Perform a low temperature post-flow, such as HDP with helium cooling;
(6) Fill over and between the conductive lines with a dielectric material.

According to the present invention, hillocks and bumps may be prevented from being formed during formation of conductive lines of a semiconductor device. In addition, formation of Ti and/or TiN barrier layers overlying conductive lines using ionized metal plasma (IMP) of Ti and Metal-Organic Chemical Vapor Deposition (MOCVD) of TiN can improve step coverage. Furthermore, according to the disclosed techniques and principles, enclosing the conductive lines can prevent formation of hillocks along an upward direction from the substrate, as well as formation of bumps along lateral directions along the upper surface of the substrate.

While certain embodiments of the inventions have been described above, it will be understood that the embodiments described are by way of example only. Accordingly, the inventions should not be limited based on the described embodiments. Rather, the scope of the inventions described herein should only be limited in light of the claims that follow when taken in conjunction with the above description and accompanying drawings.

What is claimed is:

1. A method for fabricating conductive lines of a semiconductor device, comprising:
   depositing a conductive material over a substrate to provide a conductive layer;
   depositing a first barrier layer on the conductive layer, the first barrier layer including Ti or TiN;
   patterning a mask on the first barrier layer, the pattern comprising a layout of the conductive lines;
   etching the conductive material and the first barrier layer using the patterned mask to form the conductive lines;

forming a conductive barrier layer directly on the patterned first barrier layer and over and between the conductive lines, the conductive barrier layer including an ionized metal plasma formed Ti or a metal-organic chemical vapor deposition formed TiN;

etching to remove portions of the conductive barrier layer between the conductive lines, thereby leaving portions of the conductive barrier layer on the top and sidewall portions of each of the conductive lines; and depositing a dielectric material over and between the patterned conductive lines.

2. A method according to claim 1, wherein the method further comprises depositing a Ti or Ti/TiN layer on the substrate prior to depositing the conductive material over the substrate.

3. A method according to claim 1, wherein the method further comprises in-situ cooling of the device after deposition of the conductive material.

4. A method according to claim 1, wherein depositing the first barrier layer and forming the conductive barrier layer comprises ionized metal plasma of Ti and metal-organic chemical vapor deposition of TiN.

5. A method according to claim 1, further comprising post annealing after formation of the first barrier layer.

6. A method according to claim 1, wherein the method further comprises annealing after patterning of the mask.

7. A method according to claim 1, wherein the method further comprises annealing after forming the conductive barrier layer over and between conductive lines.

8. A method according to claim 1, after forming the conductive barrier layer over and between the conductive lines, performing a low temperature post-flow using high-density plasma with helium cooling.

9. A method for fabricating conductive lines of a semiconductor device, comprising:

depositing a conductive material over a substrate to provide a conductive layer;

in-situ cooling of the device after deposition of the conductive material;

depositing a first barrier layer on the conductive layer, the first barrier layer including Ti or TiN;

annealing the device after formation of the first barrier layer;

patterning a mask on the first barrier layer, the pattern comprising a layout of the conductive lines;

etching the conductive material and the first barrier layer using the patterned mask to form the conductive lines;

forming a conductive barrier layer directly on the patterned first barrier layer and over and between the conductive lines, the conductive barrier layer including an ionized metal plasma formed Ti or a metal-organic chemical vapor deposition formed TiN;

etching to remove portions of the conductive barrier layer between the conductive lines, thereby leaving portions of the conductive barrier layer on the top and sidewall portions of each of the conductive lines;

performing a low temperature post-flow; and depositing a dielectric material over and between the patterned conductive lines.

10. A method according to claim 9, wherein depositing the first barrier layer and forming the conductive barrier layer comprises ionized metal plasma of Ti and metal-organic chemical vapor deposition of TiN.

11. A method according to claim 9, wherein the conductive barrier layer comprises Ti/TiN.

12. A method according to claim 9, wherein the method further comprises annealing after patterning of the mask.

13. A method according to claim 9, wherein the method further comprises annealing after removing portions of the conductive barrier layer between the conductive lines.

14. A method according to claim 9, wherein performing a low temperature post-flow comprises using high-density plasma with helium cooling.

* * * * *